United States Patent [19]

Matsumura et al.

[11] Patent Number: 4,486,817
[45] Date of Patent: Dec. 4, 1984

[54] METHOD OF MANUFACTURING AN ELECTRICAL CIRCUIT WIRING ARRANGEMENT

[75] Inventors: Kazuaki Matsumura; Seiki Nakanishi, both of Shiga, Japan

[73] Assignee: NEC Kansai, Ltd., Otsu, Japan

[21] Appl. No.: 409,514

[22] Filed: Aug. 19, 1982

[30] Foreign Application Priority Data

Aug. 11, 1979 [JP] Japan ................. 54-102519

[51] Int. Cl.³ ............................................. H05K 7/04
[52] U.S. Cl. .................................. 361/424; 361/380; 361/420; 361/422
[58] Field of Search .................. 29/838; 174/68.5; 339/220, 221, 258, 17 C; 361/400, 409, 331, 380, 417, 419, 420, 422, 424

[56] References Cited

U.S. PATENT DOCUMENTS

| | | | |
|---|---|---|---|
| 3,065,524 | 11/1962 | Donnell et al. | 339/17 C |
| 3,249,908 | 5/1966 | Fuller et al. | 339/98 |
| 3,252,204 | 5/1966 | McFaddan | 29/155.5 |
| 3,270,251 | 8/1966 | Evans | 317/101 |
| 3,368,188 | 2/1968 | Olsson | 339/220 R X |
| 3,447,039 | 5/1969 | Branagan | 174/68.5 X |
| 3,506,879 | 4/1970 | Maxwell et al. | 339/17 C |
| 3,680,352 | 8/1972 | Wunder | 72/410 |
| 3,713,876 | 1/1973 | Lavric | 117/102 |
| 3,927,471 | 12/1975 | Tricker | 29/625 |
| 4,173,745 | 11/1979 | Saunders | 174/68.5 X |
| 4,269,870 | 5/1981 | Boynton | 427/96 |

Primary Examiner—Howard N. Goldberg
Assistant Examiner—Carl J. Arbes
Attorney, Agent, or Firm—W. G. Fasse; D. H. Kane, Jr.

[57] ABSTRACT

A method of manufacturing an electrical circuit wiring assembly comprises the steps of preparing a first sub-assembly having a metal board chassis and a first circuit element provided with hard stiff leads, preparing a second sub-assembly having a second circuit element provided with soft thin leads and an eyelet terminal for connecting the soft thin lead to the hard lead by means of a soldered junction, and assembling the first and second sub-assemblies by a soldering operating to form a main wiring assembly. In the second sub-assembly the second circuit element and the eyelet terminal are carried temporarily on an unsolderable mounting tool. The first and second sub-assemblies are temporarily coupled to each other during the forming of the main assembly by means of a coupling tool or jig for applying molten solder to an exposed connecting portion of the eyelet terminal and to portions of the hard and soft leads extending from the eyelet terminal. After soldering, the unsolderable mounting tool and the coupling tool are removed from the soldered main wiring assembly so that a three-dimensional wiring assembly is obtained.

4 Claims, 17 Drawing Figures

METHOD OF MANUFACTURING AN ELECTRICAL CIRCUIT WIRING ARRANGEMENT

CROSS-REFERENCE TO RELATED CASE

The present application is a continuation-in-part application of copending application Ser. No. 175,960, filed Aug. 7, 1980, now U.S. Pat. No. 4,373,260, issued on Feb. 15, 1983.

BACKGROUND OF THE INVENTION

This invention relates to a method for manufacturing an electrical circuit wiring arrangement for use in high frequency tuning circuits for television receivers, and more particularly, to a soldering method of the circuit elements in the wiring assembly constructed for facilitating the mounting of the circuit elements.

Generally, electrical circuit wiring arrangements or systems fall into two groups, namely, the two-dimensional printed wiring system or the three-dimensional wiring system. In printed circuits a sheet of insulating material is used as a printed circuit board which is advantageous for an automatic assembly and soldering, but the screening effect of a metal chassis is lacking. The insulating material of the printed circuit board increases the capacitances between the connections. Moisture can cause some conduction along the surface of the printed circuit board. On the other hand, a manual wiring system or so-called "jungle" wiring system is advantageous for achieving desirable high frequency characteristics due to diminishing stray capacitances, and for desirable economical and space-factor aspects without using any printed circuit board.

The following are the good aspects of the two-dimensional configuration and of the three-dimensional configuration of wiring systems respectively. A two-dimensional configuration printed wiring system has the following advantages. (1) The final assemblies are very constant in their characteristics from one set to another, (2) compensations can be introduced in the wiring itself, (3) the circuit arrangement is very distinct and neat with all points readily accessible, and (4) the assembling and soldering are suitable for an automatic production or an assembly line. In the so-called jungle wiring system having a three-dimensional configuration the advantages are as follows, (1) all critical connections can be short, because they can cross each other, (2) capacitances are low, mutually and with respect to the chassis, (3) the wiring has a small surface area, and (4) a printed circuit board for supporting the circuit elements is eliminated.

It is therefore desirable to provide an improved system having these advantages of the conventional systems in combination. In other words, it is sought to apply an automatic soldering method for producing a jungle wiring system in the same manner as that for the printed wiring system. Conventional wiring systems still leave room for improvement, especially as far as minimizing the assembly size and dimension is concerned. This applies to simplifying the assembly, as well as to lowering the manufacturing costs and to improving the electrical performance of these circuits.

OBJECTS OF THE INVENTION

In view of the foregoing, it is the aim of the invention to achieve the following objects singly or in combination:

to provide a method for manufacturing a new and improved electrical circuit wiring arrangement for high frequency applications, wherein an easily assembled construction simplifies the circuit arrangement of the jungle wiring system and wherein the number of printed circuit boards is reduced, whereby the circuit arrangement may be manufactured with subassembly techniques in an economic manner;

to provide a new and improved electrical circuit wiring assembly for a high frequency tuner construction mounted on the chassis base in such a sub-assembly manner that mass production methods may be employed for its manufacture;

to provide a low cost and small size electrical circuit wiring assembly for soldering circuit elements without using any printed circuit board;

to provide a new and improved soldering method for electrical circuit wiring arrangements using circuit element supporting means instead of a printed circuit board; and to provide an improved and simplified manufacturing method for a high frequency circuit assembly using eyelet terminals to electrically and mechanically connect different type circuit elements to each other, whereby jig or mounting tool means for supporting the eyelet terminals are employed in an automatically simplified step of dip-soldering for connecting first and second circuit elements to each other as well as for connecting soft and thin leads of second circuit elements to each other.

SUMMARY OF THE INVENTION

This invention provides a method for manufacturing an electrical circuit wiring arrangement having different types of circuit elements, one of which includes a hard and stiff lead portion and the other of which includes a soft and thin lead portion. The stiff leads of the first type of circuit elements are mounted on a plate metal chassis base by a step of relatively high temperature soldering whereby the stiff lead portions extend from said chassis base. The thin leads of the second type of circuit elements are connected to the extending stiff lead portions and to each other by means of eyelet terminals located near one side of the chassis base. Each eyelet terminal is soldered to connect the leads of the first and/or second circuit elements by a soldering operation similar to that used in a two-dimensional configuration as well as that used in printed circuit wiring. A jig or mounting tool in the form of an unsolderable supporting plate such as synthetic resin or stainless steel is employed to temporarily hold the eyelet terminals. The mounting tool is provided with through-holes for receiving each eyelet terminal during production steps including at least the inserting of the leads, soldering, cutting undesired lead portions, and re-soldering for correcting any bad connection. The soft leads of the second circuit elements are connected to the eyelet terminals and to the hard leads of the first circuit elements mounted on the chassis base.

In one aspect of this invention, an electrical circuit wiring arrangement useful for high frequency circuits such as a television tuner, comprises a plurality of first circuit elements having stiff leads, a metal board of a shielding chassis base, a plurality of second circuit elements having thin leads, and terminal means for connecting a stiff lead and a thin lead with solder to form a given circuit, wherein the first circuit elements are fixed to the metal board of the chassis base by a first type of soldering material, and the second circuit elements are connected electrically and mechanically to each other and/or to predetermined first circuit elements by terminal means in the form of a soldered junction. In this manufacturing process the second circuit elements are supported by unsolderable supporting means for locating the second circuit elements near the chassis base to solder the connecting points of the lead portions. It is advantageous to use eyelet terminals for the soldered junctions of the leads or terminal means and to use an unsolderable mounting jig or tool such as a stainless steel plate as a supporting means which is removable from the completed circuit wiring so as to repeatedly employ the mounting tool in the manufacturing process.

This circuit wiring assembly is very advantageous because it improves the high frequency characteristics without using any printed circuit boards and it reduces the production costs. Particularly, since the eyelet terminals guide both types of leads, the connections between the first and second circuit elements are achieved effectively by soldering portions of the stiff leads of the first circuit elements and/or the thin leads of the second circuit elements together with the eyelet terminals which are mounted on the unsolderable supporting means at given positions. In one practical use, the circuit wiring assembly of this invention is useful in stator side tuner circuits of VHF tuners, for example. In such a case, a top wall of the chassis base is used as the metal board on which the first circuit elements such as earth terminals, phono-jacks, through-type capacitors and the like are fixed by the specific shape of the solder material to form a first sub-assembly for the first circuit elements. On the other hand, the second circuit elements include in this example tuning parts such as coils, capacitors, resistors, diodes, transistors and the like which are connected by low temperature molten solder material at the lead portions of the circuit elements extending from the eyelet terminals. The second circuit elements are located near one side of the metal board chassis base and between the eyelet terminals. The first and second circuit elements are connected to each other in the eyelet terminals by the molten solder which easily bonds to the leads and to the eyelets by filling any voids in the eyelet due to capillary action.

Another aspect of this invention provides an improved manufacturing process for the circuit wiring assembly, which comprises first soldering a plurality of first circuit elements to a metal board chassis base as a first sub-assembly, preparing a jig or mounting tool in the form of a supporting plate made of a material that cannot be soldered, with a plurality of through-holes for receiving eyelet terminals in a removable manner, inserting the thin leads of a plurality of second circuit elements into the eyelet terminals so as to form a second sub-assembly, assembling the first and second sub-assemblies to form a main assembly with a given space between the chassis base and the supporting plate by inserting stiff leads of the first circuit elements into a tube portion of the eyelet terminals by using an assembly tool, second soldering all lead portions in the eyelet terminals to electrically and mechanically connect the leads and eyelet terminals for forming soldered junctions of the circuit wiring, and removing the mounting tool from the soldered junctions of the second sub-assembly. If necessary, any excessive lead lengths may be cut off.

Any defective soldered junctions may be corrected in a third resoldering step to repair voids and cracks in the eyelet terminal.

The first soldering step is performed by using ring-shaped solder having a relatively high melting temperature whereby the first circuit elements are assembled on the metal board of the chassis base as the first sub-assembly. That is, the first circuit elements of the first sub-assembly are solidly fixed automatically by the solder due to heating in a conveyor type furnace. In contrast to the first soldering step, the second and third soldering steps are performed by using solder having a relatively low melting temperature. However, each soldering step may be performed by the same dip-soldering method as is used in a printed circuit board wiring system, for example, by the use of a jet stream type automatic soldering equipment for printed circuit board assemblies.

The manufacturing of the circuit wiring assemblies of this invention is capable of being automatically performed in a manner used for making ordinary printed circuit board assemblies. One important advantageous effect of the present method using eyelet terminals is obtained by the capillary effect which causes the molten solder to fill these eyelet terminals. Another advantage resides in the use of jig or mounting tools for the soldering steps without using any printed circuit board, and the disposition of each circuit element is kept strictly in the correct position because the second and/or third soldering steps are done in the assembled state of the mounting and assembly tools. The third soldering step is applied only for correcting any defective soldered contact after the cutting step for removing any unnecessary lead portions.

The present circuit wiring assembly has especially advantageous electrical characteristics for application to high frequency circuits such as VHF tuner circuits for a turret type tuner comprising a rotatable tuning selecting mechanism and a stationary main circuit. The present electrical circuit wiring assembly is also advantageous from economical view points. That is, when the main circuit of the stator side is assembled on the top wall of the shielding chassis base and the channel selection is done by switching a plurality of tuned coil segments disposed in the rotatable turret body, the stator side circuit of this invention allows for and contributes to an automatic and simplified assembly. Additionally, it stabilizes and improves the performance of the high frequency characteristics of such tuners.

BRIEF FIGURE DESCRIPTION

In order that the invention may be clearly understood, it will now be described, by way of example, with reference to the accompanying drawings, wherein.

DETAILED DESCRIPTION OF PREFERRED EXAMPLE EMBODIMENTS AND OF THE BEST MODE OF THE INVENTION

Figure 1:
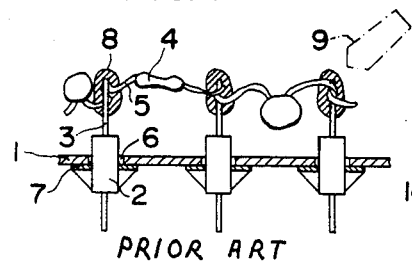
FIG. 1 is a side plan view partially in section of a conventional circuit assembly.
Figure 2:
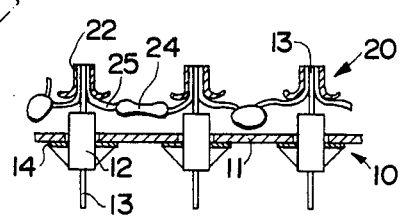
FIG. 2 is a side view partially in section of an electrical circuit wiring assembly of this invention.
Figure 3:
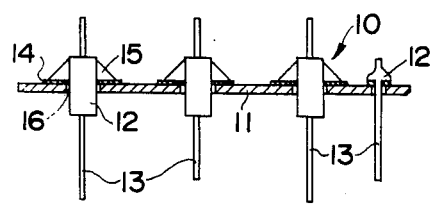
FIG. 3 is a side view of a portion of FIG. 2, showing a stage after forming a first sub-assembly of first circuit elements on a metal board or chassis base.

The electrical circuit wiring assembly of this invention is explained by referring to FIGS. 2 to 7 in comparison to a conventional circuit wiring assembly shown in FIG. 1. In FIG. 1, the conventional three-dimensional type jungle circuit assembly comprises a metal board 1, a plurality of first circuit elements 2 with stiff leads 3, and a plurality of second circuit elements 4 with thin leads 5, wherein each of the first circuit elements 2 inserted into each through-hole 6 of the metal board 1 is soldered thereto by soldering material 7, and each of the thin leads 5 of the second circuit elements 4 is connected with a respective stiff lead 3 of the first circuit element 2 by a soldered junction 8. However, such conventional soldered junctions have been made by a manual soldering method employing a soldering iron 9, which makes the assembling work very difficult and complicated.

Figure 5:
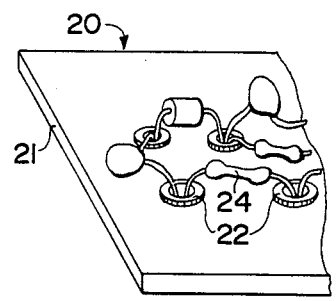
FIG. 5 is a partially perspective view of the sub-assembly of FIG. 4.
Figure 4:
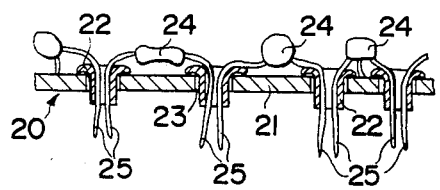
FIG. 4 is a side view similar to that of FIG. 3, but showing a stage after forming a second sub-assembly of second circuit elements on an unsolderable supporting plate of a mounting tool or jig.
Figure 7:
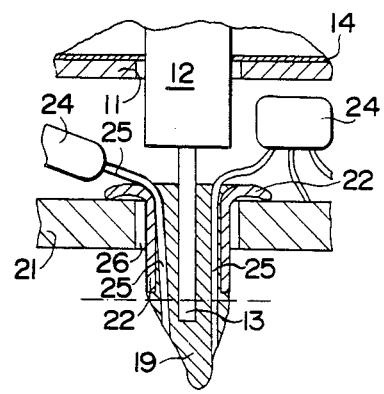
FIG. 7 is an enlarged view of a portion of FIG. 6.
Figure 6:
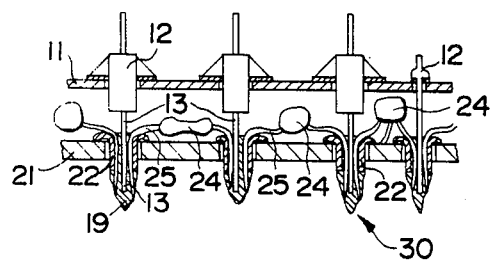
FIG. 6 is a side view similar to that of FIG. 3, but showing a final assembly stage illustrating the relationship of the first and second circuit elements.

According to this invention the manufacturing of an electrical circuit wiring assembly has been adapted to an automatic manufacturing operation. According to FIGS. 2 to 7, the circuit wiring process of this invention includes three steps of first soldering for forming a first sub-assembly 10 including a chassis base 11 of a metal board and a plurality of first circuit elements 12 with stiff leads 13; preparing a second sub-assembly 20 shown in FIG. 4 including an unsolderable supporting board 21 as a mounting tool or jig, eyelet terminals 22 disposed at the receiving holes 23 and a plurality of second circuit elements 24 with thin leads 25. A second soldering step results in a combination or main assembly 30 including the first and second sub-assemblies 10 and 20. In the first sub-assembly 10 of FIG. 3, tthe first circuit elements 12 are fixed on the chassis base 11 respectively by soldering material 14 connecting the flange portion 15 of each circuit element 12 to the peripheral portion near the through-hole 16 in the chassis base 11. In FIGS. 4 and 5, the second circuit elements 24 of the second sub-assembly 20 are positioned on the supporting board 21 and each thin lead 25 of the elements 24 is inserted into an eyelet terminal 22 located in a respective receiving hole 23. In FIG. 6, the first and second sub-assemblies are combined to provide a given spacing between the chassis base 11 and the supporting board 21, and the second soldering step is applied to form soldered junctions 19 in each eyelet terminal 22. As shown in FIG. 7, the soldering material of the junction 19 is introduced into each eyelet terminal due to the capillary action of the eyelet on the molten solder. Any unnecessary soldering portion may be cut off as shown by the dash-dotted line, to make the finished product compact and suitable for high frequency circuit applications. FIG. 7 also shows that the gap 26 between the eyelet terminal 22 and the wall of the hole 23 in the board 21 is large enough for the easy removal of the board 21.

Figure 8:
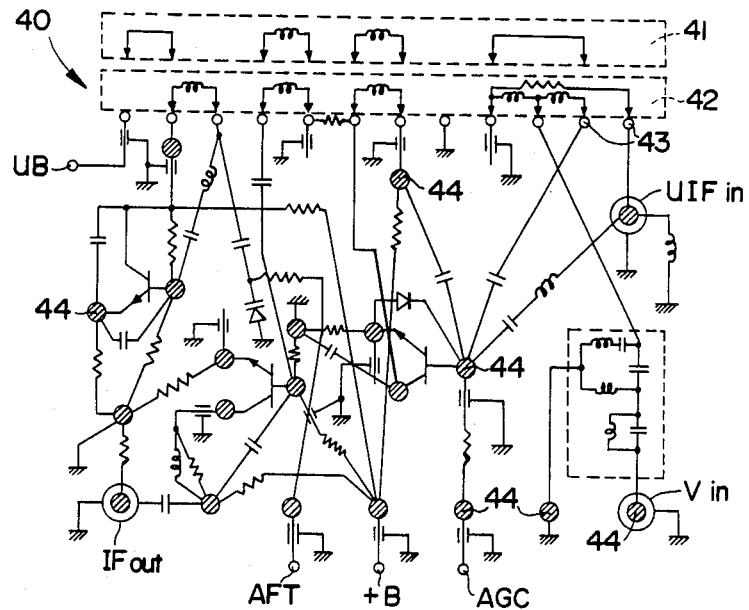
FIG. 8 is a circuit diagram of another embodiment of a circuit wiring assembly used in a turret type VHF tuner of this invention.

FIG. 8 is a circuit diagram of another embodiment used in a turret type VHF tuner which comprises rotor means of a UIF tuning unit 41, a plurality of VHF tuning units 42, and stator means of a wiring assembly 40 of this invention. The stator and rotor are electrically connected by a plurality of contact terminals 43. The feature of the circuit wiring assembly 40 is to use eyelet terminals at soldered junctions 44. For instance, the eyelet terminals are used at twenty junctions 44. As described with reference to FIGS. 2 to 7, some soldered junctions 44 are held by stiff leads of the first circuit elements 12 such as through-type capacitors, earth terminals, and phono-jack terminals which are fixed to the chassis base or metal board. Input, output and operating source terminals for the tuner circuit wiring assembly are provided by a phono-jack type UIF input terminal UIF-IN, a VHF input terminal V-IN, and an IF output terminal IF-OUT. Also, the stiff leads of the through-type capacitors provide an automatic gain control terminal AGC, a power source terminal +B, an AFT signal terminal AFT and a UHF power source terminal UB.

Figure 9:
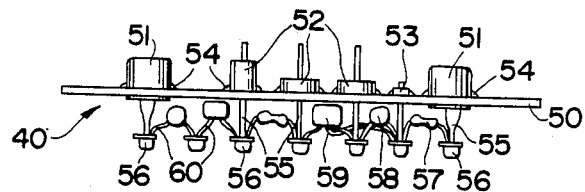
FIG. 9 is a side view of the VHF tuner assembly illustrated in FIG. 8.

FIGS. 9 to 14 are similar to FIGS. 2 to 7 and provide explanatory diagrams regarding each manufacturing step for making a circuit wiring assembly 40 of this invention. In FIG. 9, the completed circuit wiring assembly 40 includes a plurality of first circuit elements such as phono-jacks 51, through-type capacitors 52 and an earth terminal 53 fixed with solder 54 on the metal board chassis base 50. Stiff leads 55 of the first circuit elements are connected in a three-dimensional or jungle type wiring system at one side of the chassis base 50 with the leads 60 of a plurality of second circuit elements such as resistors 57, capacitors 58, and transistors 59 at each eyelet terminal 56. This circuit wiring assembly can maintain a favorable high frequency characteristic performance due to the correct disposition of the circuit elements at fixed positions in the given space without using any printed circuit boards. Accordingly, undesirable coupling effects and losses caused by stray capacitances for high frequency signals are eliminated. Economical merits are also achieved due to reducing the cost for printed circuit boards.

Figure 10:
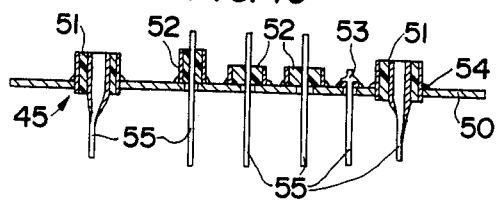
FIGS. 10 to 12 are respectively sectional views of an assembly of the circuit of FIG. 8, and showing each of the steps in the assembling process.

FIGS. 10 to 14 show sectional views for each manufacturing step of the circuit wiring assembly 40 of FIG. 8 of this invention. In FIG. 10, a first sub-assembly 45 includes the first circuit elements provided with stiff leads 55, such as phono-jacks 51, through-type capacitors 52 and an earth terminal 53, and the metal board chassis base 50 is provided with through-holes to let pass through the stiff leads 55 and to fix each first circuit element by the respective ring shaped first solder material 54 around each through-hole in the base 50. Under such condition, the first circuit elements and the chassis base are solidly interconnected by passing through a soldering furnace to melt the first solder material 54.

The step of first soldering is made in the furnace having a comparatively high temperature such as about 350° C., whereby the first soldering step is done at a higher temperature than that of a second soldering step of 260° C. for the final assembly as mentioned hereinafter.

Figure 11:
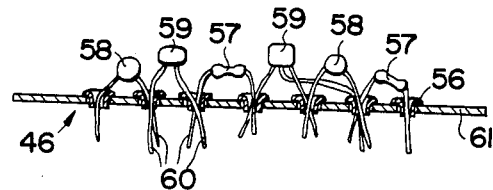
Figure 12:
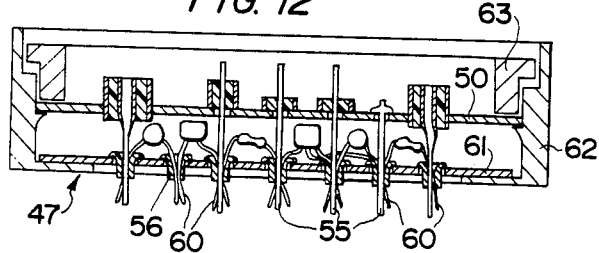

In FIG. 11, a second sub-assembly 46 for second circuit elements such as resistors 57, capacitors 58 and transistors 59 provided with thin leads 60 comprises a mounting tool or jig 61 of an unsolderable supporting plate with through-holes and a plurality of eyelet terminals 56 received in these through-holes. The mounting tool 61 is made of stainless steel or the like which cannot be soldered. The automatic insertion of the eyelet terminals 56 into each through-hole and the insertion of the second circuit elements into each eyelet terminal 56 are done easily thereby facilitating the assembling work efficiency. In FIG. 12, a combination or main assembly 47 of these two sub-assemblies 45 and 46 shown in FIGS. 10 and 11, is prepared by utilizing a lower assembly tool 62 and an upper assembly tool 63. Thus, the stiff leads 55 extending from the chassis base 50 are inserted into the eyelet terminals 56 received in the mounting tool 61, so as to provide a space between the chassis base 50 and the mounting tool 61 and to hold them in a fixed state by coupling both assembly tools 62 and 63 to each other. For instance the first sub-assembly 45 on the chassis base 50 on which the first circuit elements 51 to 53 are fixed by soldering, is placed above the second sub-assembly 46 on the mounting tool 61 on which the eyelet terminals 56 and the second circuit elements 57 to 59 are assembled, whereby the lower assembly tool 62 holds both assemblies while the upper assembly tool 63 holds both assemblies in place. The combination 47 of the sub-assemblies is held by these jig means 62 and 63 in proper positions until the completion of the final soldering step. The combination is treated with a flux application and dipped into molten solder as is the case in soldering of ordinary printed circuit boards. In a usual jet stream or flow soldering method, the inside portion of each eyelet terminal is wholly wetted with molten solder, then each of soldered junctions 64 is formed due to the action of the surface tension of the molten solder, whereby the solder crawls up within each eyelet terminal 56. This is enhanced by capillary action.

Figure 13:
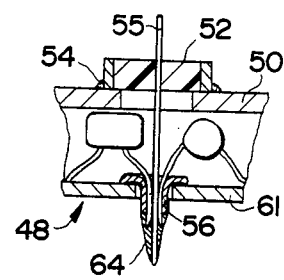
FIG. 13 is an enlarged view of a portion of the assembly of FIG. 12 illustrating the condition after the second soldering step.
Figure 14:
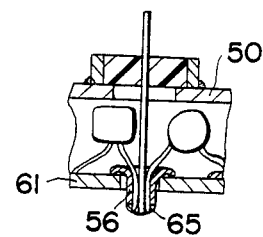
FIG. 14 is an enlarged view of a portion of the assembly of FIG. 12, but now showing the completed state.

The soldered junctions 64 in an incomplete assembly 48 may have a non-uniform shape after the second soldering treatment, as an icicle as shown in FIG. 13, and such unnecessary lead portions are removed by a cutting step. After cutting unnecessary lead portions 64 properly, sometimes caves, crevices and void portions are found inside of the eyelet terminals 56, but such portions are filled with solder by a correcting third soldering step. FIG. 14 shows the complete soldered junctions 65 after the third soldering. After the third soldering has been completed, the lower and upper assembling tools 62 and 63 and the mounting tool 61 are removed from the completed wiring assembly 40. The third soldering step is performed in the same manner as the second soldering. If the third soldering is done when the incomplete assembly 48 is still at a relatively high temperature, it is difficult to apply soldering flux. In such a case, the flux is applied by means of a rotating mat impregnated with flux to those portions requiring the third soldering. The mat avoids that flux bubbles are broken off by the jig assembly at a high temperature. The important features of the above mentioned electric circuit wiring assembly of this invention make it possible to use printed circuit soldering techniques without using any printed circuit boards, and to obtain a desirable three-dimensional or jungle type wiring system suitable for high frequency circuits. Accordingly, the cost of required parts is reduced by the omission of the printed circuit boards, and the assembling cost is also reduced by the application of automatic soldering to the three-dimensional configuration system. The soldering steps are performed by an apparatus of the same type as is used for soldering printed circuit board wiring systems whereby manual soldering is avoided. Consequently, an economically and characteristically improved electric circuit wiring assembly is produced by this invention.

Figure 15:
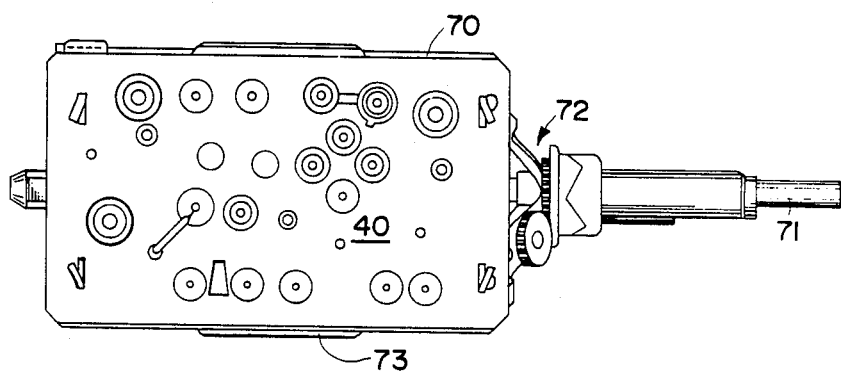
FIG. 15 is a top plan view of a tuner including the assembly of FIG. 8.
Figure 16:
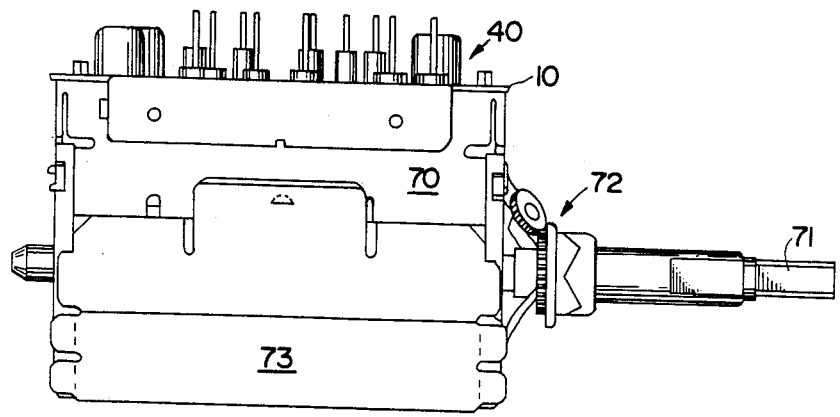
FIG. 16 is a side view of the tuner of FIG. 15.
Figure 17:
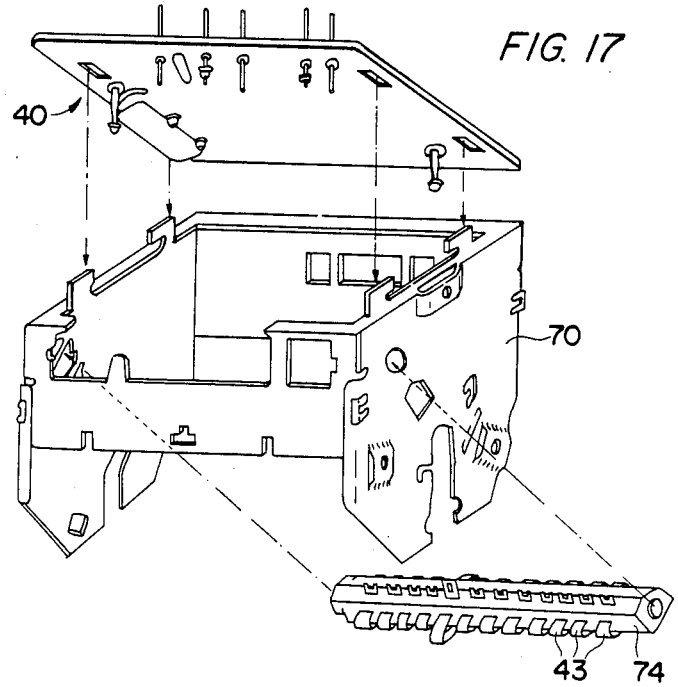
FIG. 17 is an exploded view of a stator side of the tuner of FIG. 15.

FIGS. 15 to 17 show a turret type VHF tuner as disclosed in the copending application Ser. No. 133,604 filed Mar. 24, 1980, wherein the circuit wiring assembly 40 of FIG. 8 is mounted on a chassis frame 70. A channel selector shaft 71 is journaled with detent means on the chassis frame 70, and a fine tuning mechanism 72 is mounted around the selector shaft 71. Open portions of the chassis frame 70 are covered by a shield cover 73. FIG. 17 shows a partial exploded view of this tuner, wherein the circuit wiring assembly 40 is coupled to the top of the chassis frame 70. A stator bar 74 with stator contacts 43 is operatively held in the frame 70.

Although the invention has been described with reference to specific example embodiments it will be appreciated that it is intended to cover all modifications and equivalents within the scope of the appended claims.

What is claimed is:

1. An electrical circuit wiring arrangement, comprising chassis base means (11) having through-holes, a plurality of first circuit elements (12) carried on said chassis base means and provided with stiff leads (13), a plurality of second circuit elements (24) provided with thin leads (25), and a plurality of eyelet terminals (22) connecting said stiff leads (13) of said first circuit elements (12) and said thin leads (25) of said second circuit elements (24) electrically and mechanically, wherein each of said eyelet terminals forms a soldered junction for connection at the inside of said eyelet terminal, and wherein said eyelet terminals are exclusively secured to said stiff leads and to said thin leads so that said stiff leads of said first circuit elements form the only indirect mechanical connection between the eyelet terminals and said chassis base thereby avoiding any direct mechanical connection between the eyelet terminals and said chassis base.

2. The circuit wiring arrangement of claim 1, wherein said chassis base means is a grounded shielding metal board used in a high frequency tuner, and each of said stiff leads of said first circuit elements is disposed to extend its portion to one side of said metal board.

3. An electrical circuit wiring for a high frequency circuit comprising a metal board chassis base, a plurality of first circuit elements having stiff leads, a plurality of second circuit elements having thin leads, and terminal means for connecting said stiff leads of said first circuit elements and said thin leads of said second circuit elements at soldered junctions, wherein said first circuit elements are fixed to said chassis base by first soldering material, and said second circuit elements are connected electrically and mechanically with predetermined stiff leads of said first circuit elements by said terminal means, and wherein said terminal means are exclusively secured to said stiff leads and to said thin leads so that said stiff leads of said first circuit elements form the only indirect mechanical connection between the terminal means and said chassis base thereby avoiding any direct mechanical connection between the terminal means and said chassis base.

4. The electrical circuit wiring of claim 3, wherein said terminal means comprise a plurality of eyelet terminals, and wherein said second circuit elements are placed in the space formed by said chassis base and said eyelet terminals, and are suspended between said soldered junctions formed by said eyelet terminals.

* * * * *

UNITED STATES PATENT AND TRADEMARK OFFICE
CERTIFICATE OF CORRECTION

PATENT NO. : 4,486,817
DATED : December 4, 1984
INVENTOR(S) : Kazuaki Matsumura, Seiki Nakanishi It is certified that error appears in the above—identified patent and that said Letters Patent is hereby corrected as shown below:

Title page:

In [63] the related U. S. application data should be as follows:

-- [63] CIP of U. S. Patent 4,373,260, issued February 15, 1983.--

Signed and Sealed this

Thirtieth Day of April 1985

[SEAL]

Attest:

DONALD J. QUIGG

Attesting Officer

Acting Commissioner of Patents and Trademarks